United States Patent [19]

Jain et al.

[11] Patent Number: 4,652,334
[45] Date of Patent: Mar. 24, 1987

[54] METHOD FOR PATTERNING SILICON DIOXIDE WITH HIGH RESOLUTION IN THREE DIMENSIONS

[75] Inventors: Kailash C. Jain, Sterling Heights; Bernard A. MacIver, Lathrup Village, both of Mich.

[73] Assignee: General Motors Corporation, Detroit, Mich.

[21] Appl. No.: 836,900

[22] Filed: Mar. 6, 1986

[51] Int. Cl.⁴ .................. B44C 1/22; C03C 15/00; C03C 25/06
[52] U.S. Cl. .................................... 156/628; 156/653; 156/657; 156/651; 156/644; 252/79.5
[58] Field of Search ............................ 252/79.5, 79.1; 156/628, 644, 653, 651, 657, 643, 662

[56] References Cited

U.S. PATENT DOCUMENTS

| | | | |
|---|---|---|---|
| 3,560,280 | 2/1971 | Nishida | 156/628 |
| 3,635,667 | 1/1972 | Keay et al. | 252/103 X |
| 3,769,109 | 10/1973 | MacRae et al. | 156/3 |
| 3,891,483 | 6/1975 | Messerschmitt et al. | 29/589 X |
| 3,972,770 | 8/1976 | Stein | 156/600 |
| 4,239,661 | 12/1980 | Muraoka et al. | 252/541 |
| 4,264,374 | 4/1981 | Beyer et al. | 134/3 |
| 4,339,340 | 7/1982 | Muraoka et al. | 252/79.5 |
| 4,450,041 | 5/1984 | Aklufi | 156/628 |

OTHER PUBLICATIONS

Monfret et al., "Chemical and Electrical Behavior of Ion Implanted SiO$_2$ Films", *Ion Implantation in Semiconductors,* 1971, pp. 389–396.

Watanabe et al., "Etching Rates of SiO$_2$ and Si$_3$N$_4$ Insulating Films in Ammonia-Hydrogen-Peroxide Cleaning Process", *Proc. Electro Chem. Soc.,* 83-8, pp. 488–496, (1983); CA99(20):167899f.

*Primary Examiner*—William A. Powell
*Attorney, Agent, or Firm*—Robert J. Wallace

[57] ABSTRACT

A method is provided for selectively etching ion-implanted silicon dioxide. A masked silicon dioxide layer is exposed to an ion beam of controlled dose and energy. The mask is removed and the silicon dioxide layer is brought in contact with an aqueous ammoniacal hydrogen peroxide solution which preferentially removes the ion-bombarded region with minimal etching of the unimplanted silicon dioxide.

12 Claims, 14 Drawing Figures

IMMERSE IN
NH$_4$OH:H$_2$O$_2$:H$_2$O
1:1:3

METHOD FOR PATTERNING SILICON DIOXIDE WITH HIGH RESOLUTION IN THREE DIMENSIONS

TECHNICAL FIELD

The present invention generally relates to methods for patterning layers of silicon dioxide during the fabrication of silicon based microelectronic devices such as diodes, transistors, integrated circuits, etc. More particularly, the invention deals with a method and composition for selectively removing portions of a silicon dioxide layer on a substrate to form patterned microstructures having precisely controlled dimensions.

BACKGROUND ART

Silicon dioxide is the material which is most commonly etched in the fabrication of semiconductor devices. Typically, a layer of silicon dioxide is formed on a silicon substrate by the thermal oxidation of a prepared silicon wafer surface. The silicon dioxide surface is then coated with a photoresist which is imaged with a microstructure pattern. After photo-development, the patterned photoresist serves as a mask for etching the underlying silicon dioxide layer.

Conventional silicon dioxide etching techniques utilize hydrofluoric acid-based solutions into which the masked silicon dioxide is immersed. The exposed silicon dioxide is rapidly removed while the masked silicon dioxide is generally protected by the patterned photoresist coating. However, vertical and lateral etch penetration into the silicon dioxide is difficult to control using this conventional etching technique. As the hydrofluoric acid etchant dissolves the silicon dioxide surface, uncontrolled lateral etching occurs which produces irregular cuspate etching beneath the photoresist mask. Furthermore, the exposed silicon dioxide etches at a single rate, making it difficult to produce a silicon dioxide layer having several different thicknesses.

It is well known that by bombarding silicon dioxide with accelerated ions, the etch rate of the ion-bombarded oxide can be increased. In enhancing etching by ion bombardment, high-energy ions are directed toward a resist-masked silicon dioxide layer. The ions strike exposed areas of the silicon dioxide, causing ion-bombardment damage to the oxide, while the masked areas are protected from ion damage. The depth of the ion damage in the bombarded silicon dioxide is dependent upon the ion implant dose and energy. It is known that hydrofluoric acid-based etchants etch the ion-bombarded regions more rapidly than the unimplanted regions. However, the etch rate is too fast and the etch rate differential between implanted and unimplanted oxide is too small for accurate etch control. With prior conventional etchants, the differential in etch rate between implanted and unimplanted regions is typically a multiple between about 2 and 6. These prior conventional etchants thus still produce significant unwanted lateral etching of unimplanted sidewalls. They also would produce significant vertical overetching beyond the depth of the bombarded region, if the etching is not stopped quickly enough after the thickness of the ion-bombarded area is etched away.

The increasing criticality of semiconductor device geometry parameters on device electrical performance has generated a need for a high degree of control over the etching process. It is desirable that silicon dioxide be selectively etched with submicrometer precision. For example, it may be desired to fabricate MOS transistors having various gate characteristics or threshold voltages on a single chip by providing various silicon dioxide thicknesses in the gate areas of such transistors. It may also be desired to form sharp trenches in silicon dioxide layers to promote grapho-epitaxy or to simply form smaller transistor features, such as smaller contact windows. Accordingly, there is a need for a method of precisely controlling etch parameters during silicon dioxide microstructure fabrication.

SUMMARY OF THE INVENTION

In this invention, we have discovered that an aqueous ammoniacal hydrogen peroxide solution provided such an extremely high differential etch rate between ion-bombarded and non-ion-bombarded silicon dioxide that ethcing of silicon dioxide can be precisely controlled. In accordance with the present invention, a method is provided for patterning silicon dioxide with a high degree of resolution in three dimensions. The method comprises the steps of bombarding a silicon dioxide layer with an ion beam of controlled dose and energy and then etching away the ion-implanted oxide with an aqueous ammoniacal hydrogen peroxide solution. The present method provides a differential etch rate between the ion-implanted silicon dioxide and the unimplanted silicon dioxide of approximately 30 to 1. Thus, the silicon dioxide layer can be etched with precision to a predetermined depth and lateral sidewall etching is significantly reduced. The high differential etch rate allows several different thicknesses to be formed in a single silicon dioxide layer.

It is therefore an object of the present invention to provide a method for patterning silicon dioxide which provides precise control over microstructure dimensions.

It is a further object of the invention to provide a convenient and reliable method for etching ion-implanted and unimplanted regions of silicon dioxide wherein the differential etch rate between such regions is especially high.

It is a further object of the invention to provide a method for forming openings in silicon dioxide having vertical sidewalls and precise depths.

It is a further object of the invention to provide a method for conveniently forming a single silicon dioxide layer having several different thicknesses.

It is a further object of the invention to provide a method for fabricating silicon dioxide sidewall spacers around a polysilicon gate.

These and further objects of the invention will be made clear or will become apparent during the course of the following description of a preferred embodiment of the invention.

DESCRIPTION OF THE PREFERRED EMBODIMENTS

Figure 1:
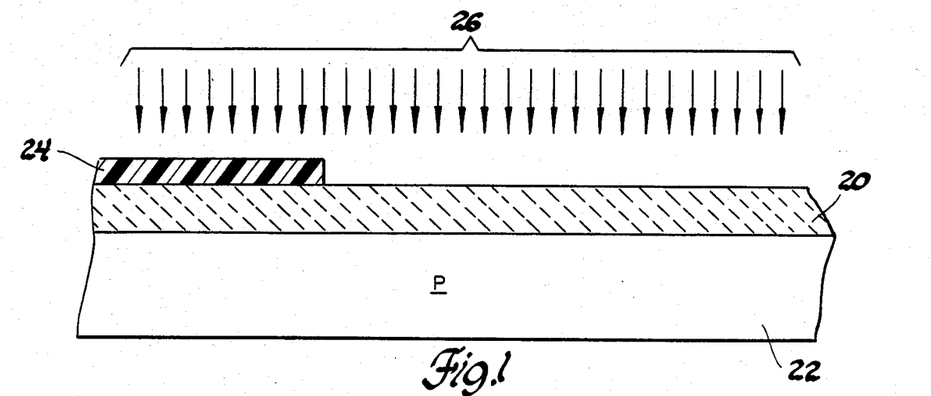
FIG. 1 is a cross-sectional view depicting the first step of the method of the present invention, wherein a photoresist masked silicon dioxide layer on a silicon substrate is being bombarded to a controlled depth with accelerated ions.

Referring first to FIG. 1 of the drawings, a semiconductor device is shown in an intermediate stage of fabrication in which a layer of silicon dioxide 20 has been grown on a polished silicon substrate 22. A portion of the silicon dioxide layer 20 is coated with a layer of photoresist 24 which is patterned and developed in a known manner to form a mask over the silicon dioxide layer 20. Using a conventional ion implanter (not shown), the silicon dioxide layer 20 and mask 24 are bombarded with high energy in the form of accelerated ions 26 from an ion source which is disposed substantially perpendicular to the silicon dioxide layer 20 surface. Silicon, fluorine and phosphorous ion implantations have been found to work equally well in connection with the present invention and the use of other suitable ions is also contemplated. The bombarding ions 26 penetrate and become implanted in the silicon dioxide layer 20. The implanted ions alter the structure of the silicon dioxide layer 20 in a manner which enhances its chemical etch rate. This structural alteration is sometimes referred to in the art as "ion damage". Thus, as used herein, the terms "ion-damaged, "ion-implanted" and "ionbombarded" regions have synonymous meanings.

The ion dose and energy are controlled such that ions 26 penetrate the silicon dioxide layer 20 to an effective predetermined depth. As will be explained more fully below, the etchant solution of the present invention provides precise control of etch depth corresponding to ion dose and energy. For example, silicon dioxide implanted with silicon ions (Si+) at an energy of 150 keV and a dose of $1 \times 10^{14}$ silicon ions per square centimeter and etched with the preferred etchant under the preferred conditions described later herein produces an etch depth in the silicon dioxide layer of about 135 nm at the damaged region, even though the non-bombarded adjacent surface is also being etched. By increasing the Si+ dose, Si+ energy, or both, the etch depth of the implanted silicon dioxide layer is increased with the present etchant. It should be noted that ions having multiple charges may also be used effectively.

Figure 2:
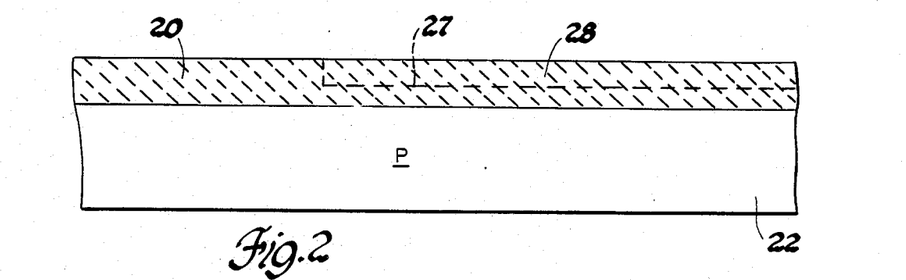
FIG. 2 shows the silicon substrate and silicon dioxide layer of FIG. 1 following removal of the photoresist, an ion-implanted region being indicated within the broken line.
Figure 3:
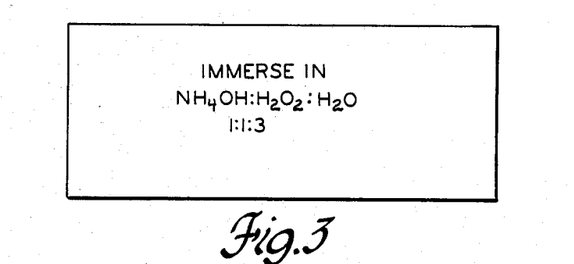
FIG. 3 illustrates the next step of the method in which the substrate and silicon dioxide layer are immersed in an etchant composition which forms another facet of the present invention.

FIG. 2 depicts the device following ion implantation and after the mask 24 is removed, the ion-implanted silicon dioxide 28 portion of the silicon dioxide layer 20 being shown within the broken line 27. Following the controlled ion implantation, the silicon substrate 22 and silicon dioxide layer 20 with the ion-implanted region 28 is immersed in an etchant bath as is schematically shown in FIG. 3. The preferred volumetric composition of etchant which has been found to provide a desired differential etch rate between implanted and unimplanted silicon dioxide of at least 30 to 1 contains about one part of an aqueous NH$_4$OH solution (28 to 30 percent NH$_3$ by weight), about one part of an aqueous H$_2$O$_2$ solution (30 percent H$_2$O$_2$ by weight) and about three parts H$_2$O. This corresponds to an actual initial composition containing 3.25 mole percent hydrogen peroxide and 6.5 mole percent ammonium hydroxide. On the other hand, this preferred initial concentration can be increased or reduced by at least 10 percent, when used under the conditions we hereinafter describe. In fact, if the following principles are appropriately observed, one may vary this preferred initial composition even more.

One reason whey the etchant composition can be varied even more is that the etchant composition is in fact not constant when it is used. It decreases significantly in hydrogen peroxide content during use. The reason for the decrease is that hydrogen peroxide decomposes fairly rapidly at temperatuers of about 80°–90° C. Accordingly, the hydrogen peroxide to ammonium hydroxide ratio decreases dramatically during etching, from the initial 1:1 volumetric ratio.

It appears, for example, that after the first half hour of etching, i.e., after the first half hour of being at about 80°–90° C., the hydrogen peroxide content in the etchant decreases, due to thermal decomposition, to about 10 percent or less of its initial hydrogen peroxide content. This is equivalent to only about 0.1 part or less of the hydrogen peroxide solution used to formulate the etchant. With this in mind, we wish to point out that we prefer to etch with an etchant that has been freshly prepared at room temperature. Also, we prefer to start etching as soon as the etchant has been heated to a temperature of 80°–90° C.

Our tests indicate that hydrogen peroxide suppresses etching of unimplanted silicon dioxide. However, it does not observably suppress etching of the implanted silicon dioxide. However, we recognize that the implantation may simply enhance etching of the silicon dioxide so much that the effect of hydrogen peroxide on it was not observable to us. It also appears that only a small amount of hydrogen peroxide, equivalent to only about 0.05 parts by volume of the 30 percent by weight aqueous hydrogen peroxide solution, need be present in our aqueous ammoniacal solution to be effective in so selectively suppressing etching of unimplanted silicon dioxide. This is equivalent to about 0.16 mole percent hydrogen peroxide in the etchant. As can be understood from the foregoing, we choose to use a much larger initial concentration, i.e., about 3.25 mole percent hydrogen peroxide, primarily to insure that a small but effective hydrogen peroxide concentration remains in the etchant for substantially the entire etching time, even though the hydrogen peroxide is continuously decomposing. In this way, we insure that highest etching selectivity, i.e., differential etch rate, is obtained.

With the foregoing in mind, we wish to note that we also prefer to add more of the aforementioned hydrogen peroxide solution to the etchant every fifteen minutes that the etchant is at 80°-90° C. As a practical matter, this means that a small quantity of fresh hydrogen peroxide is added to our etchant every fifteen minutes during etching. For an initial etchant volume of about 1000 ml., we would add about 50 ml. of the 30 percent by weight aqueous hydrogen peroxide solution to the etchant every fifteen minutes. Based on the initial formulation, this is about 0.05 parts by volume. We are not certain this addition is necessary. However, it insures that a hydrogen peroxide content of at least 0.8 mole percent is maintained in the etchant substantially throughout the etching time.

The ammonium hydroxide concentration in our etchant should be about 5 mole percent to 7 mole percent during substantially the entirety of the etching time, if one desires maximum etching differential between implanted and unimplanted silicon dioxide. This is equivalent to an initial formulation of one part of the 28–30 percent $NH_3$ by weight aqueous solution, one part of the 30 percent hydrogen peroxide solution and about 3–5 parts of water. As ammonium hydroxide concentration increases above the foregoing, etch rate differential between implanted and unimplanted silicon dioxide decreases, even though etch rate increases. Accordingly, stronger ammoniumm hydroxide concentrations are generally not preferred. More dilute ammonium hydroxide concentrations are not desired because they provide an undesirably slow rate. Moreover, since etching time with dilute solutions becomes so prolonged, it may be necessary, not just desirable, to periodically add fresh hydrogen peroxide to the etchant, in order to maintain a high etch rate differential.

It should be recognized from the foregoing that one could start with an etchant initially formed with no hydrogen peroxide in it at all. It would contain only one part by volume ammonium hydroxide (28–30 percent by weight $NH_3$) and three or four parts by volume water. In such instance, one would periodically or continuously add the hydrogen peroxide component to the etchant during etching. The hydrogen peroxide could be added in any convenient solid or liquid form, including an aqueous solution of any convenient strength. Enough hydrogen peroxide would be added to the etchant, frequently enough, to maintian a minimum concentration of hydrogen peroxide in the etchant substantially throughout etching of at least about 0.8 mole percent. In such instance, the preferred initial ammonium hydroxide concentration used would be related to the extent the etchant is diluted by the hydrogen peroxide additions.

It should also be appreciated that there are additives known for aqueous hydrogen peroxide solution that inhibit thermal decomposition of the hydrogen peroxide. Such inhibitors may prove to be useful in our invention, too. In such instance, they may reduce the preferred initial concentraiton of hydrogen peroxide that is used and/or the frequency and amount of hydrogen peroxide added during etching.

During immersion of the device in the etchant bath, the etchant is preferably maintained at a temperature of approximately 80° C. to 90° C., as hereinbefore indicated. Although etching temperatures substantially below this range may produce acceptable results, the etch rate of the implanted silicon dioxide is undesirably slow. Appreciably higher temperatures produce an objectionably high rate of hydrogen peroxide decomposition, which may adversely affect the etch rate differential, unless more hydrogen peroxide is added to the etchant during etching. It has been found that etching the ion-implanted wafer in a bath of the etchant in the preferred concentration at 85° C. for approximately three hours in a reflux-type apparatus provides an etch rate differential of about 32 to 1, implanted to unimplanted regions. These are the preferred conditions referred to in the foregoing description, following the description of FIG. 1. It has also been found that immersion for three hours in the etchant fully removes the iondamaged silicon dioxide with only a nominal amount of non-damaged silicon dioxide being etched. Although the length of time that the device is immersed in the etchant bath is not critical, it must be exposed to the etchant long enough to completely remove the intended thickness of ion-implanted silicon dioxide, e.g. from two to four hours. The etch rate differential can be determined from the following equation:

$$\sigma = d/(t - t_0)$$

where d is the etch depth of the etched ion-implanted silicon dioxide, t is the unimplanted silicon dioxide thickness prior to immersion in the etchant, and $t_0$ is the unimplanted silicon dioxide thickness following removal from the etchant.

Figure 4:
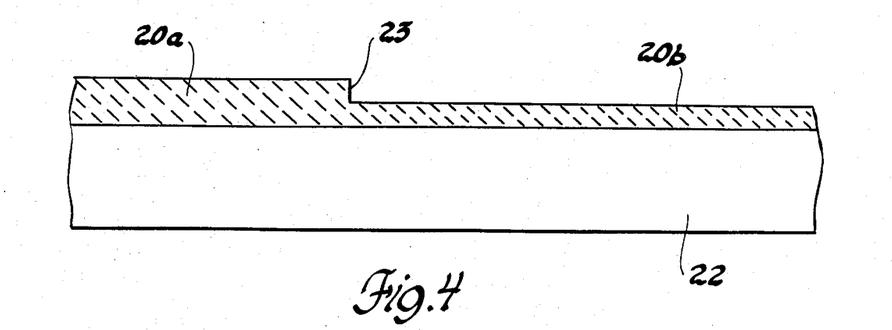
FIG. 4 shows the silicon dioxide layer and silicon substrate after the bombarded region has been removed by the etchant.

FIG. 4 depicts the device after it has been removed from the etch bath and clearly shows the ion-implanted region having been removed to create two distinct thicknesses 20a and 20b of silicon dioxide separated by a sharp vertical wall 23 that is essentially free from lateral etching which is normally experienced when prior art etchants are employed.

Figure 5:
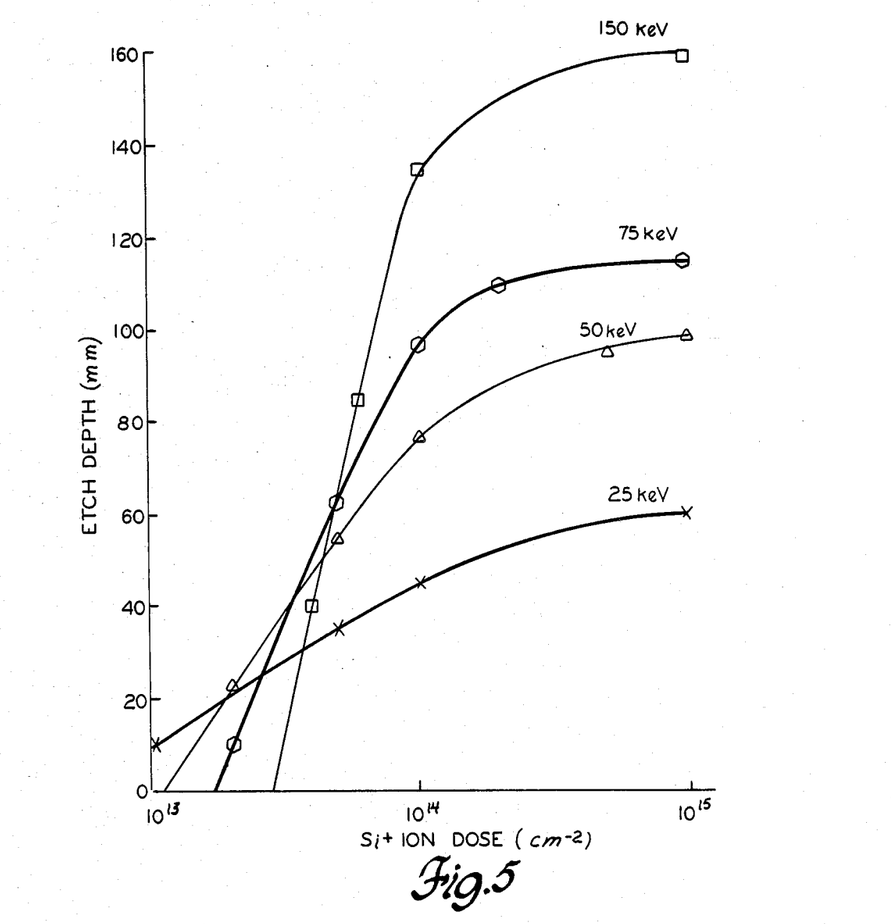
FIG. 5 is a graph which illustrates the relationship of silicon dioxide etch depth to ion dose and ion energy.

A number of samples of silicon wafers were etched using the present etchant, with various dosages and implantation energy levels. The results of such tests are shown in FIG. 5 which is a plot of etch depth versus silicon ion dosage at various energy levels. From this plot it is apparent that by adjusting the implant dose and energy, the etch depth can be controlled rather precisely.

Figure 6:
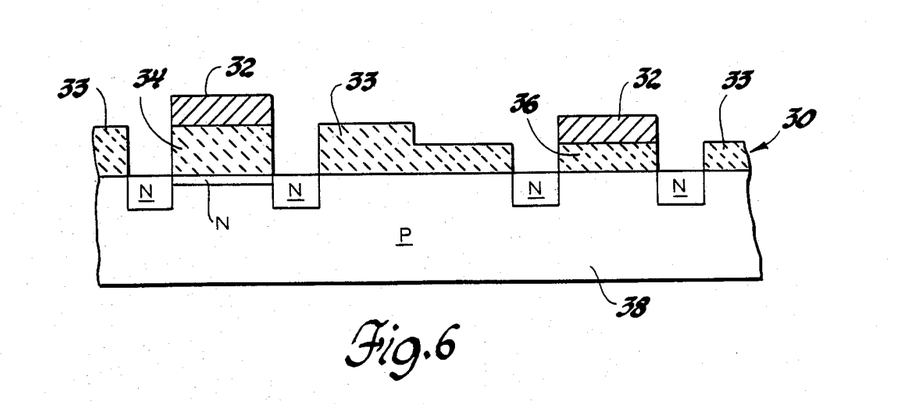
FIG. 6 is a cross-sectional view of a depletion and enhancement mode device having unequal thicknesses of silicon dioxide beneath the gate electrodes.

The present etchant can be advantageously employed to control the thicknesses of silicon dioxide in various types of microelectronic devices. For example, it is known that one of the factors affecting the threshold voltage of MOS transistors is the thickness of the gate oxide. By controlling the etch depth of silicon dioxide using the present etchant, gates with different silicon dioxide thicknesses can be created as is shown in FIG. 6. FIG. 6 depicts a depletion and enhancement mode transistor 30 which is fabricated using the etchant of the present invention. The gate electrodes 32 are respectively formed on the two different thicknesses of silicon dioxide layers 34 and 36. The P doped silicon substrate 38 is shown with doped N regions and an N doped channel region in the depletion device. The unused oxide 33 may be removed using conventional techniques.

Figure 7:
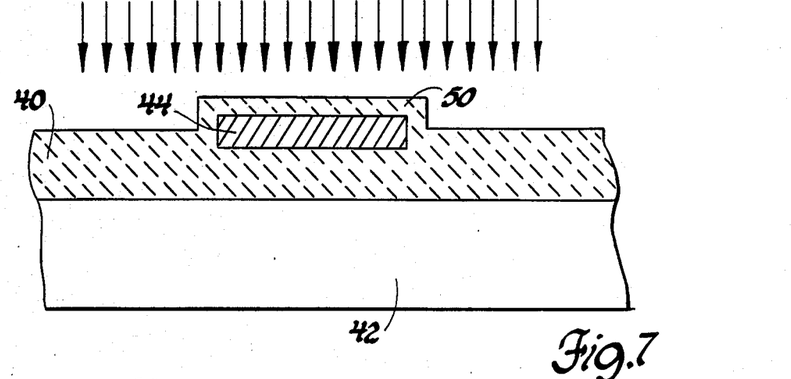
FIG. 7 is a cross-sectional view of a silicon substrate having a polysilicon gate enclosed in silicon dioxide and being bombarded with accelerated ions.
Figure 8:
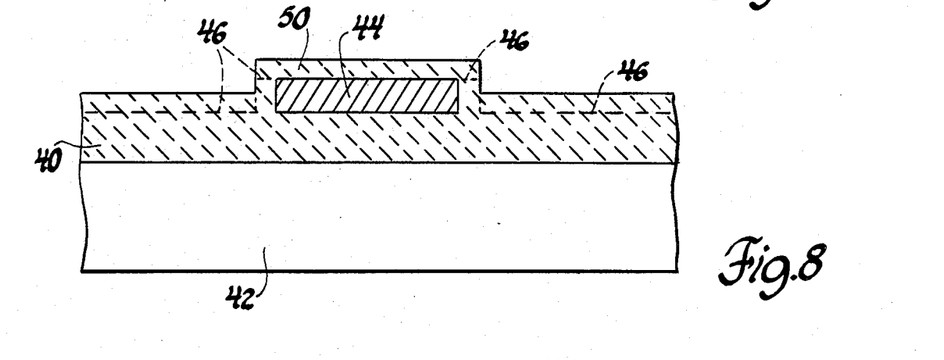
FIG. 8 is a view similar to FIG. 7 wherein the ion-implanted regions of silicon dioxide are indicated within broken lines.
Figure 9:
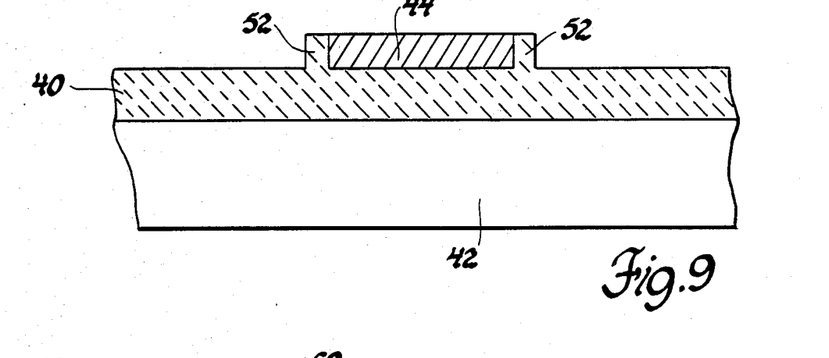
FIG. 9 is a cross-sectional view showing the substrate of FIG. 8 after etching to expose the polysilicon gate.

FIGS. 7 through 9 illustrate the formation of silicon dioxide sidewalls around a layer of patterned polycrystalline silicon using the etchant of the present invention. A layer of silicon dioxide 40 is generated on a prepared silicon substrate 42. A layer of polysilicon 44 is then deposited onto the silicon dioxide 40, following which another layer 50 of silicon dioxide is applied over the polysilicon 44 and silicon dioxide 40 to produce the configuration shown in FIG. 7. As shown in Figure 7, the silicon dioxide layers 40 and 50 are then implanted with ions to a target depth corresponding to the thickness of the silicon dioxide layer 50. The ion implanted silicon dioxide regions are depicted above the broken lines 46 in FIG. 8. Following implantation, the device is immersed in the etch bath of the present invention, wherein the implanted regions are etched away. With the implanted regions having been etched away, the polysilicon 44 is thus exposed at the top thereof but is surrounded by the silicon sidewalls 52. As will be appreciated by those skilled in the art, fabrication of sidewalls in accordance with the present invention is a preferable alternative to the conventional technique of forming sidewalls by silicon nitride deposition and etching.

Figure 10:
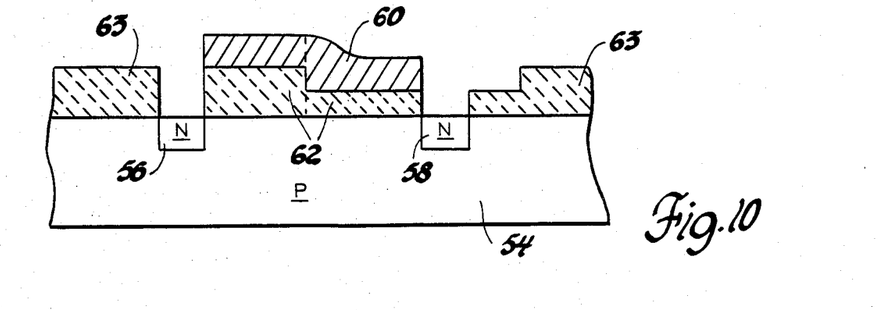
FIG. 10 is a cross-sectional view of a tailored drain breakdown MOSFET having a stair-stepped layer of silicon dioxide beneath a gate electrode.

Reference is now made to FIG. 10, wherein a tailored drain breakdown MOSFET is shown, having a P doped substrate 54, an N doped drain 56, and a source 58. The gate electrode 60 has been deposited on the stair-stepped layers 62 of silicon dioxide which are fabricated utilizing the method and composition of the present invention. The unused oxide 63 may be removed using conventional techniques.

Figure 11:
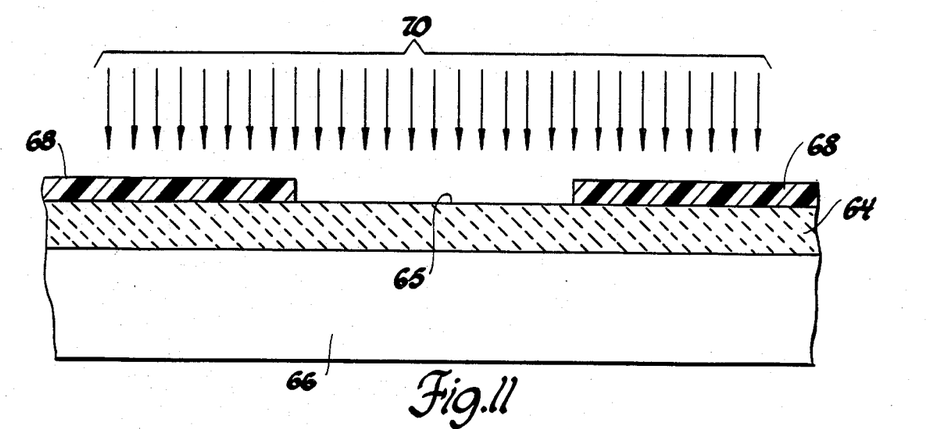
FIG. 11 is a cross-sectional view of a photoresist masked silicon dioxide layer on a silicon substrate being bombarded by accelerated ions.

FIGS. 11 through 14 illustrate the successive steps in forming a device having a contact window which extends through a silicon dioxide layer 64. As shown in FIG. 11, the device includes a silicon substrate 66 onto which there has been formed a layer 64 of silicon dioxide. A mask (not shown) is employed to apply a layer 68 of photoresist onto the silicon dioxide layer 64, the mask having formed an opening 65 in the photoresist layer 68 so that the silicon dioxide 64 beneath the opening 65 may be exposed to bombardment of ions 70 from a suitable source.

Figure 12:
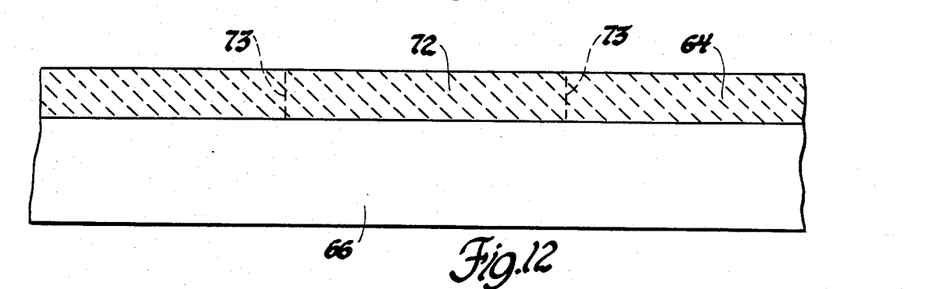
FIG. 12 is a view similar to FIG. 11, but with the ion-implanted region of silicon dioxide being indicated within the broken lines, the photoresist having been stripped.

After ion implantation, the photoresist layer 68 is removed, as shown in FIG. 12. The ion damaged region 72 of the silicon dioxide layer 64 is indicated between the broken lines 73 and is disposed beneath the opening 65 (FIG. 11) in the photoresist 68 which has been removed.

Figure 13:
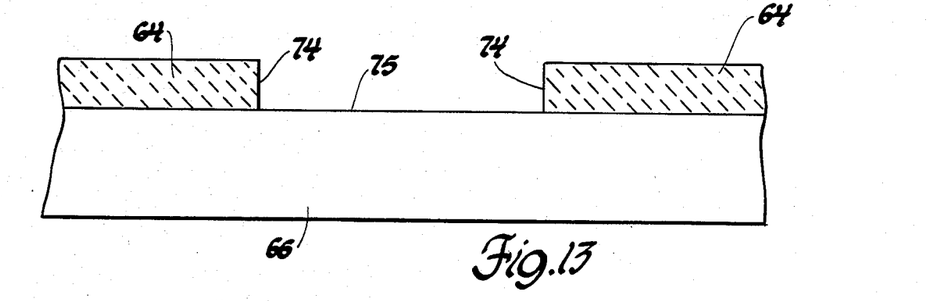
FIG. 13 is a view similar to FIG. 12, but after the contact window has been etched; and, FIG. 14 is a cross-sectional view similar to FIG. 13, but showing a single-crystal silicon epitaxial layer having been deposited in the contact window.

The device is then immersed in the etchant of the present invention to remove the ion-implanted region 72. FIG. 13 depicts the device following etching, in which the removal of the ion-implanted region has formed a "contact window" 75 between the sharp vertical sidewalls 74, which extends through the silicon dioxide layer 64 to the substrate 66.

Figure 14:
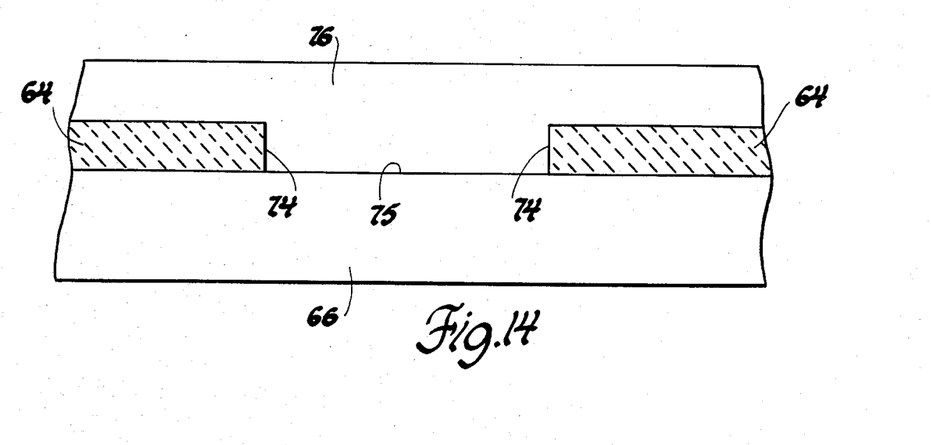

The contact window 75 may then be used as a diffusion mask or for grapho-epitaxy. The vertical sidewalls 74 in the silicon dioxide layer 64 promote the formation of a single-crystal epitaxial layer 76 which can be deposited in the contact window as shown in FIG. 14. The vertical sidewalls 74 permit uniform crystal growth within the contact window 75.

Further explanation of the present invention will now be provided by way of the following examples which are intended to be purely exemplary of the use of the invention.

EXAMPLE I

A layer of thermal silicon dioxide of approximately 250 nm thickness was grown on polished silicon wafers. The silicon dioxide layer was coated with photoresist which was patterned for use as an implant mask. The masked silicon dioxide layer was then implanted with $Si^+$ ions at several different doses and energies as plotted in FIG. 5. The photoresist was next stripped and the silicon dioxide thickness, t, was measured on a Dektak ® surface profiler to be 245 nm. The samples were then etched for 180 minutes in a solution containing one part $NH_4OH$ (28 to 30 percent by weight $NH_3$), one part $H_2O_2$ (30 percent by weight), and three parts $H_2O$, which was held in a beaker at 85° C. that was kept covered with an evaporating dish to minimize evaporation of constituents. After etching, the etch depth, d, and the final silicon dioxide thickness, $t_0$, were measured on the surface profiler. For the sample implanted with 150 keV $Si^+$ at $1\times10^{15}$ silicon ions $cm^{-2}$, the etch depth at the implanted region was measured to be 160 nm. The final thickness of unimplanted silicon dioxide was 240 nm, giving a differential etch rate of 32.

EXAMPLE II

Using the photoresist masked wafers prepared in the preceding example, samples were exposed to 25 keV $Si^+$ at a dose of $1\times10^{14}$ silicon ions $cm^{-2}$. The ion-implanted samples were then immersed in the etchant solution at the preferred concentration and temperature for approximately 180 minutes. The etch depth of the implanted oxide was 45 nm.

EXAMPLE III

Using the photoresist masked wafers prepared in the manner set forth in Example I, the masked silicon dioxide layer was exposed to 25 keV $Si^+$ at a dose of $1\times10^{13}$ silicon ions $cm^{-2}$. The ionimplanted samples were then immersed in the etchant solution at the preferred temperature for approximately three hours. The etch depth of the ion-implanted silicon dioxide was 10 nm.

The etch depth for all samples tested at the various ion doses and energies when etched with the preferred concentration of the etchant at the preferred temperature for approximately three hours are plotted in FIG. 5.

Having thus described the invention, it is recognized that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A method of etching a layer of silicon dioxide, comprising the steps of:
   implanting ions in said silicon dioxide layer to enhance the chemical etchability of said silicon dioxide layer; and,
   applying an aqueous ammoniacal hydrogen peroxide solution to the surface of the ion-implanted silicon dioxide layer.

2. The method recited in claim 1, wherein said aqueous ammoniacal hydrogen peroxide solution contains an ammonium hydroxide concentration equal to that provided by about one part of an aqueous NH₄OH solution having from about 28 percent to about 30 percent NH₃ by weight, about three to five parts H₂O, and at least a small concentration of hydrogen peroxide that is effective in suppressing etching by the ammonium hydroxide of unimplanted silicon dioxide areas but not implanted silicon dioxide areas.

3. The method recited in claim 2, wherein said aqueous ammoniacal hydrogen peroxide solution is maintained at a temperature of about 80° C. to about 90° C. during application to said silicon dioxide surface.

4. The method recited in claim 2, wherein said silicon dioxide layer is exposed to said ammoniacal hydrogen peroxide solution from about one hour to about three hours.

5. The method recited in claim 1, wherein the implanted ions are selected from the group consisting of silicon, phosphorous and fluorine.

6. The method recited in claim 5, wherein the ion implantation is performed by bombarding said silicon dioxide layer with ions having energies from about 25 keV to about 150 keV at a dose of about $1 \times 10^{13}$ ions cm$^{-2}$ to about $1 \times 10^{15}$ ions cm$^{-2}$.

7. A method of etching an ion-damaged silicon dioxide layer, comprising the steps of:
preparing an etchant solution containing NH₄OH, H₂O₂ and H₂O; and,
immersing said ion-damaged silicon dioxide layer in said etchant solution.

8. The method recited in claim 7, wherein said etchant solution is a solution equivalent to that containing about one part of an aqueous NH₄OH solution having a concentration of about 28 percent to about 30 percent NH₃ by weight, at least about one part of an aqueous H₂O₂ solution having about 30 percent H₂O₂ by weight, and from about one part to about three parts H₂O.

9. A method of etching silicon dioxide to form microstructures used in the fabrication of a semiconductor device, comprising the steps of:
forming a layer of silicon dioxide on a substrate;
masking a portion of said silicon dioxide;
damaging the molecular structure of the unmasked portions of said silicon dioxide by exposing said silicon dioxide to a source of ions which penetrate the unmasked portion of said silicon dioxide layer;
removing said mask from said silicon dioxide layer; and,
etching the damaged portions of said silicon dioxide layer by immersing said silicon dioxide layer in an etchant bath containing a solution of NH₄OH, H₂O₂, and H₂O to form said microstructures.

10. A method of etching a layer of silicon dioxide, comprising the steps of:
implanting ions in said silicon dioxide layer to enhance the chemical etchability of said silicon dioxide layer; and,
applying an aqueous ammoniacal hydrogen peroxide solution containing at least 0.8 mole percent hydrogen peroxide and from about 5 mole percent to about 7 mole percent ammonium hydroxide to the surface of the ion-implanted silicon dioxide layer.

11. The method recited in claim 10, including the step of maintaining the at least 0.8 mole percent concentration of hydrogen peroxide by periodically adding hydrogen peroxide to said aqueous hydrogen peroxide solution.

12. A method of etching a layer of silicon dioxide, comprising the steps of:
implanting ions in said silicon dioxide layer to enhance the chemical etchability of said silicon dioxide layer;
applying an aqueous ammoniacal hydrogen peroxide solution containing at least 0.8 mole percent hydrogen peroxide and from about 5 mole percent to about 7 percent ammonium hydroxide to the surface of the ion-implanted silicon dioxide layer; and,
maintaining said aqueous ammoniacal hydrogen peroxide solution at a temperature of about 80° C. to about 90° C. during said applying step.

* * * * *

UNITED STATES PATENT AND TRADEMARK OFFICE
CERTIFICATE OF CORRECTION

PATENT NO.    : 4,652,334

DATED         : March 24, 1987

INVENTOR(S)   : Kailash C. Jain; Bernard A. MacIver

It is certified that error appears in the above-identified patent and that said Letters Patent is hereby corrected as shown below:

Substitute the attached new Sheets 2 and 3 of the drawing for Sheets 2 and 3 in the original printed copy of this patent.

Signed and Sealed this

Seventh Day of February, 1989

*Attest:*

DONALD J. QUIGG

*Attesting Officer*     Commissioner of Patents and Trademarks